(12) United States Patent
Usui

(10) Patent No.: US 6,306,254 B1
(45) Date of Patent: Oct. 23, 2001

(54) INTERLEAF PAPER FOR PHOTOSENSITIVE PRINTING PLATE MATERIAL

(75) Inventor: Takayuki Usui, Haibara-gun (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/053,726

(22) Filed: Apr. 2, 1998

(30) Foreign Application Priority Data

Apr. 4, 1997 (JP) ................................................ 9-086995

(51) Int. Cl.[7] .......................... D21F 11/00; B32B 23/08; G03C 1/492
(52) U.S. Cl. ......................... 162/158; 162/135; 428/342; 428/511; 428/514; 436/273.1; 436/300; 436/511
(58) Field of Search .............................. 430/273.1, 300, 430/301, 302, 303; 428/511, 537.5; 162/135, 137, 158, 168.1, 177, 183, 185, 164.1, 231; 101/395, 128.21, 128.4, 456, 453, 454, 455, 457, 458, 459, 460, 461, 462, 463.1, 464, 465, 466, 467

(56) References Cited

U.S. PATENT DOCUMENTS

| | | | |
|---|---|---|---|
| 3,625,353 | * | 12/1971 | Ishii ................................ 206/63.2 R |
| 4,072,528 | * | 2/1978 | Bratt ..................................... 96/87 R |
| 4,149,798 | * | 4/1979 | McGowan et al. ....................... 355/8 |
| 4,505,778 | * | 3/1985 | Robertson ............................. 162/135 |
| 4,589,648 | * | 5/1986 | Hancock ............................... 271/106 |
| 4,942,111 | * | 7/1990 | Wade et al. ........................... 430/273 |
| 4,990,428 | * | 2/1991 | Shimizu et al. ...................... 430/276 |
| 5,124,559 | * | 6/1992 | Zertani et al. ..................... 250/492.1 |
| 5,302,417 | * | 4/1994 | Yamauchi et al. ................. 427/385.5 |
| 5,378,579 | * | 1/1995 | Arimatsu et al. .................... 430/281 |
| 5,496,677 | * | 3/1996 | Toyama et al. ...................... 430/162 |
| 5,522,157 | * | 6/1996 | Howey et al. ......................... 34/460 |
| 5,695,862 | * | 12/1997 | Lacz et al. ........................... 428/212 |
| 5,786,127 | * | 7/1998 | Madoux et al. .................. 430/273.1 |

FOREIGN PATENT DOCUMENTS

| | | | |
|---|---|---|---|
| 51-6570 | * | 7/1974 | (JP) . |
| 60-73538 | * | 4/1975 | (JP) . |
| 50-151136 | * | 12/1975 | (JP) . |

* cited by examiner

*Primary Examiner*—Blaine Copenheaver
*Assistant Examiner*—Kevin R. Kruer
(74) *Attorney, Agent, or Firm*—Sughrue, Mion, Zinn, Macpeak & Seas, PLLC

(57) ABSTRACT

The interleaf paper for covering a photosensitive printing plate material which is coated with a water-soluble oxidization preventing layer, is characterized in that the interleaf paper has air permeability of between about 15 seconds and about 300 seconds. If the photosensitive printing plate material is covered with the interleaf paper, it is possible to release the interleaf paper in the automatic interleaf paper releasing apparatus and stabilize the sensitivity of the photosensitive printing plate material in a short period of time.

5 Claims, No Drawings

INTERLEAF PAPER FOR PHOTOSENSITIVE PRINTING PLATE MATERIAL

BACKGROUND OF THE INVENTION

1. Field of the Invention

The present invention relates to interleaf paper for photosensitive printing plate material, and more particularly to interleaf paper for protecting a water-soluble oxidation preventing layer formed on the photosensitive printing plate.

2. Description of Related Art

In a conventional method of manufacturing a photosensitive printing plate, a metal support such as an aluminum plate is coated with a photopolymerizing mixture, which is composed of a chemical compound including an ethylene type double bond which can addition-polymerize, a photopolymerization starting agent, an organic high molecular compound, and a thermal-polymerization prohibiting agent. The photosensitive printing plate is covered with a film of a desired original image and is exposed, and thereby, the photopolymerizing mixture of exposed areas polymerizes and hardens. Then, the photopolymerizing mixture of unexposed areas is dissolved and removed. Thus, a hardened relief image is formed on the printing plate.

Japanese Patent Provisional Publication No. 55-118041, Japanese Patent Publication No. 61-19025 and Japanese Patent Provisional Publication No. 57-99647 disclose interleaf paper which protects the printing plate material. The interleaf paper aims to improve the cutting, the adhesion and the releasability.

Research on the high photosensitivity printing plate, which is made of photopolymerizing sensitive material, has further developed, and the printing plate has been is applied to a variety of applied fields. In particular, a laser direct plate making system conformable to a laser oscillation wavelength such as 488 nm of the argon ion laser and 532 nm of FD-YAG laser has already been put to practical use. To use the photopolymerization type as the printing plate material, a water-soluble polymer layer as an oxidation preventing layer is ordinarily formed on the printing plate material.

Recently, interleaf paper covering the above-mentioned printing plate has been material is automatically released. To use the printing plate material of the photopolymerization type for the laser direct plate making system, it is necessary to provide the interleaf paper with a performance conformable to the automatic interleaf paper releasing apparatus Examples of the automatic interleaf paper releasing apparatus are a machine which releases the interleaf paper by shifting it with a rubber roller, etc., a machine which releases the interleaf paper by sucking the interleaf paper with a sucking disc, etc. and a machine which blows the interleaf paper off by air pressure.

U.S. Pat. No. 4,336,093 relating to Japanese Patent Publication No. 57-23259 discloses an interleaf paper for covering the photosensitive printing plate material coated with the water-soluble oxidation preventing layer (water-soluble barrier layer to prevent oxygen), and the interleaf paper is coated with plastic so that the interleaf paper can be released by the automatic interleaf paper releasing apparatus by being sucked with the sucking disc, etc. of the apparatus.

When the printing plate material is covered with an interleaf paper coated with plastic, a high voltage is applied to the interleaf paper to charge it electrically and the interleaf paper electrostatically adheres to the printing plate material. Then, the interleaf paper is released when the printing plate material is used.

If the plastic coating layer of the interleaf paper adheres to the water-soluble oxidation preventing layer formed on the photosensitive printing plate, there is a problem in that it takes a long time until the sensitivity of the photosensitive printing plate is stabilized, since air hardly permeates the interleaf paper, that is, the air permeability of the interleaf paper is too low. The air permeability (ISO 3687-1976) represents a property of the paper against permeation of air, and it is expressed as the time which is required for 100 $cm^3$ of air to pass through 645 $mm^2$ of the paper.

On the other hand, if the air permeability of the interleaf paper is too high, the sucking disc, etc. of the automatic interleaf paper releasing apparatus cannot release the interleaf paper, since the photosensitive printing plate material as well as the interleaf paper is sucked. Hence, the interleaf paper which is coated with plastic is not conformable to a variety of automatic interleaf paper releasing apparatuses.

SUMMARY OF THE INVENTION

The present invention has been developed in view of the above-described circumstances, and has as its object the provision of an interleaf paper for covering a photosensitive printing plate material coated with a water-soluble oxidation preventing layer which paper enables stabilization of the sensitivity of the photosensitive printing plate material in a short period of time and can be released by an automatic interleaf paper releasing apparatus.

To achieve the above-mentioned object, the interleaf paper of the present invention for a photosensitive printing plate material which is coated with a water-soluble oxidation preventing layer, is characterized in that the interleaf paper has air permeability of between about 15 seconds and about 300 seconds.

The present invention does not employ interleaf paper coated with plastic, but uses interleaf paper has an air permeability between about 15 seconds and about 300 seconds. Since the air permeability of the interleaf paper is between about 15 seconds and about 300 seconds, the sensitivity of the photosensitive printing plate material can stabilize in a short period of time. Moreover, the sucking disc, etc. of the automatic interleaf paper releasing apparatus can suck and release the interleaf paper, and thus, the interleaf paper can be conformable to a variety of automatic releasing apparatuses.

EXAMPLE

This invention will be described in further detail by way of example.

Embodiment 1

Bleached kraft pulp was beaten and dissolved in water to make density of about 4%. About 0.4 wt % of a synthetic size agent was added to the raw material mixture, and aluminum sulfate was added to the raw material mixture until pH of the raw material mixture reaches about 5.0. Paper was made of the stuff raw material mixture, and about 3.0 wt % of paper strength additive consisting essentially of starch was applied on an paper. Thus, the interleaf paper for covering the photosensitive printing plate material was produced, of which weight was about 38 $g/m^2$, density was about 0.8 $g/cm^3$, flatness (ISO 5627-1984) was about 60 seconds and moisture was about 6.0%.

Embodiment 2

An interleaf paper was produced in the same manner as in the embodiment 1, except that about 2 $g/m^2$ of polyvinyl alcohol was applied on the interleaf paper.

Control Example 1

An interleaf paper was produced in the same manner as in the embodiment 1, except that the paper strength additive consisting essentially of starch was not applied on the paper.

Control Example 2

An interleaf paper was produced in the same manner as in the embodiment 1, except that one side of the paper was laminated with polyethylene.

U.S. Pat. No. 4,336,093 relating to Japanese Patent Publication No. 57-23259 describes the laminating method in detail.

Measurement of Air Permeability

The interleaf paper was cut into a sheet of 50 mm×130 mm, and time required for 100 cm$^3$ to pass through an area of 645 mm$^2$ by a Gurley densometer was measured. ISO 3687-1976 (JIS P 8117) describes a method of measuring the air permeability in detail.

Evaluation on Conformability of Interleaf Paper to Automatic Interleaf Paper Releasing Apparatus A photosensitive printing plate was produced as follows. An aluminum base material of 0.3 mm thickness which had been grained and anodized was coated with a photopolymerizing photosensitive mixture, which consisted mainly of polymerizing monomer including an ethylene type unsaturated group, methacrylic polymer, and photo polymerization starting agent, so that the coating amount after drying could be 1.4 g/m$^2$. Then, the coated base material was dried at 100° C. for two minutes. Thus, a photosensitive layer was formed. A water solution of polyvinyl alcohol (saponification rate 98.5 mol %, degree of polymerization 500) was applied on the photosensitive layer so that the coating amount after drying could be 2.4 g/m$^2$, and the base material was dried at 100° C. for three minutes. Thus, the photosensitive printing plate was produced. Each of the interleaf paper in the embodiments 1 and 2 and the control examples 1 and 2 was adhered to the photosensitive printing plate by corona charging at −8 kV. In the control example 2, the polyethylene layer of the interleaf paper adhered to the water-soluble oxidation preventing layer of the photosensitive printing plate. Then, the photosensitive printing plate was cut into a sheet of 1030 mm×800 mm, and an automatic interleaf paper releasing apparatus sucked the interleaf paper with a sucking disc under the conditions of 25° C. and 50% RH. It was visually observed whether only the interleaf paper could be sucked and released or not.

Evaluation on Stability of Sensitivity of Photosensitive Printing Plate

Each of the interleaf paper in the embodiments 1 and 2 and the control examples 1 and 2 was adhered to the photosensitive printing plate, which was produced as described above, by corona charging at −8 kV. In the control example 2, the polyethylene layer of the interleaf paper adhered to the water-soluble oxidation preventing layer of the photosensitive printing plate. Then, the photosensitive printing plate was cut into sheets of 1030 mm×800 mm, and they were aged under the conditions of 25° C. and 50% RH. Just after cutting and five and ten days later, the interleaf paper of each sample was released and the photosensitive printing plate was exposed to a visible light.

The visible light was a monochromatic light shined through an optical filter, which was manufactured by Kenko Corporation, JAPAN, from a xenon lamp light source. The sensitivity was measured by means of a FUJI PS guide (a step tablet which is manufactured by Fuji Photo Film Co., Ltd. and which has fifteen steps in which the transmission optical density increases by 0.15 from an original step of 0.05). The photosensitive printing plate was exposed for twenty-four seconds with the illumination intensity being 0.0132 mW/cm$^2$ on the surface of the photosensitive layer, and then, it was heated at 100° C. for one minute. Thereafter, the photosensitive printing plate was soaked in a developing solution, which consisted of 30 g of 1K potassium silicate, 15 g of potassium hydroxide, 3 g of $C_{12}H_{25}$—$C_6H_4$—O—$C_6H_4$—$SO_3Na$ and 1000 g of water, at 25° C. for twenty seconds. Thereby, the photosensitive printing plate was developed. The changes in sensitivity were represented with clear steps of the PS step guide.

The Results of Evaluation

TABLE 1 shows the results of the evaluation of the interleaf paper in the embodiments 1 and 2 and the control examples 1 and 2.

TABLE 1

| | Air permeability [second] | Conformability to automatic interleaf paper releasing apparatus | Sensitivity [clear step] | | |
|---|---|---|---|---|---|
| | | | Just after cutting | 5 days later | 10 days later |
| Embodiment 1 | 15 | Only interleaf paper could be sucked | 10.25 | 8.5 | 8.5 |
| Embodiment 2 | 300 | Only interleaf paper could be sucked | 10.25 | 8.5 | 8.5 |
| Control example 1 | 13 | Photosensitive printing plate as well as interleaf paper was sucked | 10.25 | 8.5 | 8.5 |
| Control example 2 | More than 400 | Only interleaf paper could be sucked | 10.25 | 9.5 | 8.5 |

As shown in TABLE 1, in the cases of the interleaf paper in the embodiments 1 and 2, it was possible to suck only the interleaf paper in the automatic interleaf paper releasing apparatus. To the contrary, in the case of the interleaf paper in the control example 1, the photosensitive printing plate material as well as the interleaf paper was sucked, since the air permeability of the interleaf paper in the control example 1 was too high. For this reason, it was impossible to release the interleaf paper in the automatic interleaf paper releasing apparatus. In the case of the interleaf paper in the control example 2, it took a long period of time until the sensitivity of the photosensitive printing plate material was stabilized, since the air permeability of the interleaf paper in the control example 2 was too low. For this reason, the photosensitive printing plate material covered with the interleaf paper in the control example 2 cannot be used for a long period of time until the sensitivity thereof is stabilized.

Hence, in these embodiments, the air permeability of the interleaf paper was set between about 15 seconds and about 300 seconds. If the photosensitive printing plate material coated with the water-soluble oxidation preventing layer is covered with interleaf paper of which air permeability is between about 15 seconds and about 300 seconds, the photosensitive printing plate material can be used without waiting for a long period of time until the sensitivity thereof is stabilized, and the interleaf paper can be conformable to a variety of automatic interleaf paper releasing apparatuses.

As set forth hereinabove, the interleaf paper of which air permeability is between about 15 seconds and about 300 seconds is employed, and thus, it is possible to stabilize the sensitivity of the photosensitive printing plate material in a short period of time, and the interleaf paper can be conformable to a variety of automatic interleaf paper releasing apparatuses.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. Interleaf paper for a photosensitive printing plate material which is coated with a water-soluble oxidation preventing layer, wherein said interleaf paper has air permeability of between about 15 seconds and about 300 seconds to thereby absorb air and separate said interleaf paper from said photosensitive printing plate and stabilize the sensitivity of said photosensitive printing plate, wherein the air permeability of the interleaf paper is adjusted by applying a paper strength additive consisting essentially of starch, wherein said interleaf paper of which weight, density, flatness and moisture are about 38 $g/m^2$, about 0.8 $g/cm^3$, about 60 seconds and about 6.0%, respectively, is produced by beating bleached kraft pulp, dissolving the pulp in water to make a raw material mixture having a density of about 4%, adding about 0.4 wt % of a synthetic size agent to the raw material mixture, adding aluminum sulfate to the raw material mixture until pH of the raw material mixture reaches about 5.0, making paper from the raw material mixture, and applying about 3.0 wt % of the paper strength additive on the paper.

2. The interleaf paper for the photosensitive printing plate material as defined in claim 1, wherein the surface of said interleaf paper is coated with about 2 $g/m^2$ of polyvinyl alcohol.

3. An interleaf paper-covered photosensitive printing plate, comprising (1) a photosensitive printing plate comprising a metal support having coated thereon, in order, a photopolymerizable mixture and a water-soluble oxidation preventing layer, and (2) an interleaf paper having an air permeability of between about 15 seconds and about 300 seconds to stabilize the sensitivity of said photosensitive printing plate, wherein the interleaf paper is present on the photosensitive printing plate, and wherein the air permeability of the interleaf paper is controlled by adding a starch, wherein said interleaf paper of which weight, density, flatness and moisture are about 38 $g/m^2$, about 0.8 $g/cm^3$, about 60 seconds and about 6.0%, respectively, is produced by beating bleached kraft pulp, dissolving the pulp in water to make a raw material mixture having a density of about 4%, adding about 0.4 wt % of a synthetic size agent to the raw material mixture, adding aluminum sulfate to the raw material mixture until pH of the raw material mixture reaches about 5.0, making paper from the raw material mixture, and applying about 3.0 wt % of the paper strength additive on the paper.

4. The interleaf paper-covered photosensitive printing plate material as defined in claim 3, wherein the surface of said interleaf paper is coated with about 2 $g/m^2$ of polyvinyl alcohol.

5. A method of stabilizing a sensitivity of a photosensitive printing plate, comprising the step of:

covering a photosensitive printing plate comprising a metal support, a photosensitive resin mixture and a water-soluble oxidation prevention layer with an interleaf paper with an air permeability of between 15 seconds and 300 seconds to thereby quicken stabilization of said photosensitive printing plate, wherein said interleaf paper of which weight, density, flatness and moisture are about 38 $g/m^2$, about 0.8 $g/cm^3$, about 60 seconds and about 6.0%, respectively, is produced by beating bleached kraft pulp, dissolving the pulp in water to make a raw material mixture having a density of about 4%, adding about 0.4 wt % of a synthetic size agent to the raw material mixture, adding aluminum sulfate to the raw material mixture until pH of the raw material mixture reaches about 5.0, making paper from the raw material mixture, and applying about 3.0 wt % of paper strength additive consisting essentially of starch on the paper.

* * * * *